(12) United States Patent
Satoh et al.

(10) Patent No.: US 6,310,422 B1
(45) Date of Patent: Oct. 30, 2001

(54) SURFACE ACOUSTIC WAVE FILTER

(75) Inventors: Yuki Satoh; Toru Sakuragawa; Mitsuhiro Furukawa; Ryouichi Takayama, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/423,772

(22) PCT Filed: Mar. 10, 1999

(86) PCT No.: PCT/JP99/01150

§ 371 Date: Feb. 28, 2000

§ 102(e) Date: Feb. 28, 2000

(87) PCT Pub. No.: WO99/46857

PCT Pub. Date: Sep. 16, 1999

(30) Foreign Application Priority Data

Mar. 12, 1998 (JP) .................................................. 10-060867

(51) Int. Cl.⁷ ...................................................... H03H 9/25
(52) U.S. Cl. ........................................................ 310/313 R
(58) Field of Search .......................................... 310/313 R

(56) References Cited

U.S. PATENT DOCUMENTS 6,166,611 * 12/2000 Seki et al. ......................... 310/313 B

FOREIGN PATENT DOCUMENTS

| | | | |
|---|---|---|---|
| 58-138423 | 8/1982 | (JP) . | |
| 58-37222 | 3/1983 | (JP) . | |
| 64-38821 | 3/1989 | (JP) | H03H/9/145 |
| 1-238099 | 9/1989 | (JP) | H05K/7/20 |
| 4-311041 | 11/1992 | (JP) | H01L/21/338 |
| 5-235689 * | 9/1993 | (JP) | 310/313 R |
| 6-29773 * | 2/1994 | (JP) | 310/313 R |
| 06112762 | 4/1994 | (JP) | H03H/9/25 |
| 07264000 | 10/1995 | (JP) | H03H/9/64 |
| 8-181563 * | 7/1996 | (JP) | 310/313 R |
| 09098046 | 4/1997 | (JP) | H03H/7/46 |
| 09121138 | 5/1997 | (JP) | H03H/9/25 |

* cited by examiner

Primary Examiner—Thomas M. Dougherty
(74) Attorney, Agent, or Firm—Ratner & Prestia

(57) ABSTRACT

The present invention relates to a surface acoustic wave filter used in frequency filter of portable telephone and other mobile communication device, and is intended to realize a surface acoustic wave filter capable of obtaining a stable filter characteristic even in the event of input of a large signal. The invention includes resonators (5) to (8) formed on a piezoelectric substrate (3), through-holes (12) provided near the resonators (5) to (8), and a conductive material (13) filling up the through-holes (12), in which the through-holes (12) filled up with the conductive material (13) are electrically grounded. In this constitution, by the through-holes (12) provided near the resonators (5) to (8) and filled up with the conductive material (13), the heat generated in the resonators (5) to (8) when a large signal is applied to the input terminal (1) can be released, so that a stable filter characteristic may be maintained if a large signal is applied.

11 Claims, 5 Drawing Sheets

(a)

(b)

SURFACE ACOUSTIC WAVE FILTER

THIS APPLICATION IS A U.S. NATIONAL PHASE APPLICATION OF PCT INTERNATIONAL APPLICATION PCT/JP99/0115005583.

TECHNICAL FIELD

The present invention relates to a surface acoustic wave filter used in frequency filter of portable telephone and other mobile communication device.

BACKGROUND ART

FIG. 5 shows a constitution of a conventional surface acoustic wave filter. In FIG. 5, reference numeral 101 is an input terminal, 102 is an output terminal, 103 is a piezoelectric substrate, 105 to 108 are resonators provided on a signal line 104a on the piezoelectric substrate 103, and this surface acoustic wave filter is composed of a comb-shaped electrode pattern (not shown) and reflector patterns (not shown) provided at its both ends. Further, reference numeral 109 is a package, 110a to 100f are lands formed in the package 109, and 111a to 111f are wires for connecting the resonators 105 to 108 in the signal line 104a and a ground pattern 104b.

Herein, by composing the resonators 105 to 108 on the piezoelectric substrate 103 by means of the comb-shaped electrode pattern and reflector patterns provided at its both ends, an elastic vibration is induced to the surface. By operating as the resonators by making use of this elastic vibration, the frequency filter, that is, the surface acoustic wave filter is obtained.

In this constitution, however, when a large input signal is applied to the input terminal 101, a sudden temperature rise takes place in the resonators 105 and 106, in particular, closer to the input terminal 101, and it may cause migration in the metal composing the comb-shaped electrode pattern (usually aluminum or aluminum alloy), thereby leading to precipitation, oxidation or deterioration, and the desired filter characteristic might not be obtained.

That is, the conventional surface acoustic wave filter has been known as a filter generally capable of obtaining a steep filter characteristic, but it was designed to handle a small signal and limited in the range of use, and hence it was difficult to handle a large signal in the surface acoustic wave filter

SUMMARY OF THE INVENTION

The invention is devised in the light of the above problems, and it is therefore an object thereof to present a surface acoustic wave filter capable of obtaining a stable filter characteristic if a large current is applied in the input terminal.

To achieve the object, the invention comprises resonators formed on a piezoelectric substrate, through-holes provided near the resonators, and a conductive material filling up the through-holes, in which the through-holes filled with the conductive material are electrically grounded. In this constitution, by the through-holes provided near the resonators and filled up with the conductive material, the heat generated in the resonators when a large signal is applied to the input terminal can be released, and a stable filter characteristic may be maintained if a large signal is entered.

Figure 1:
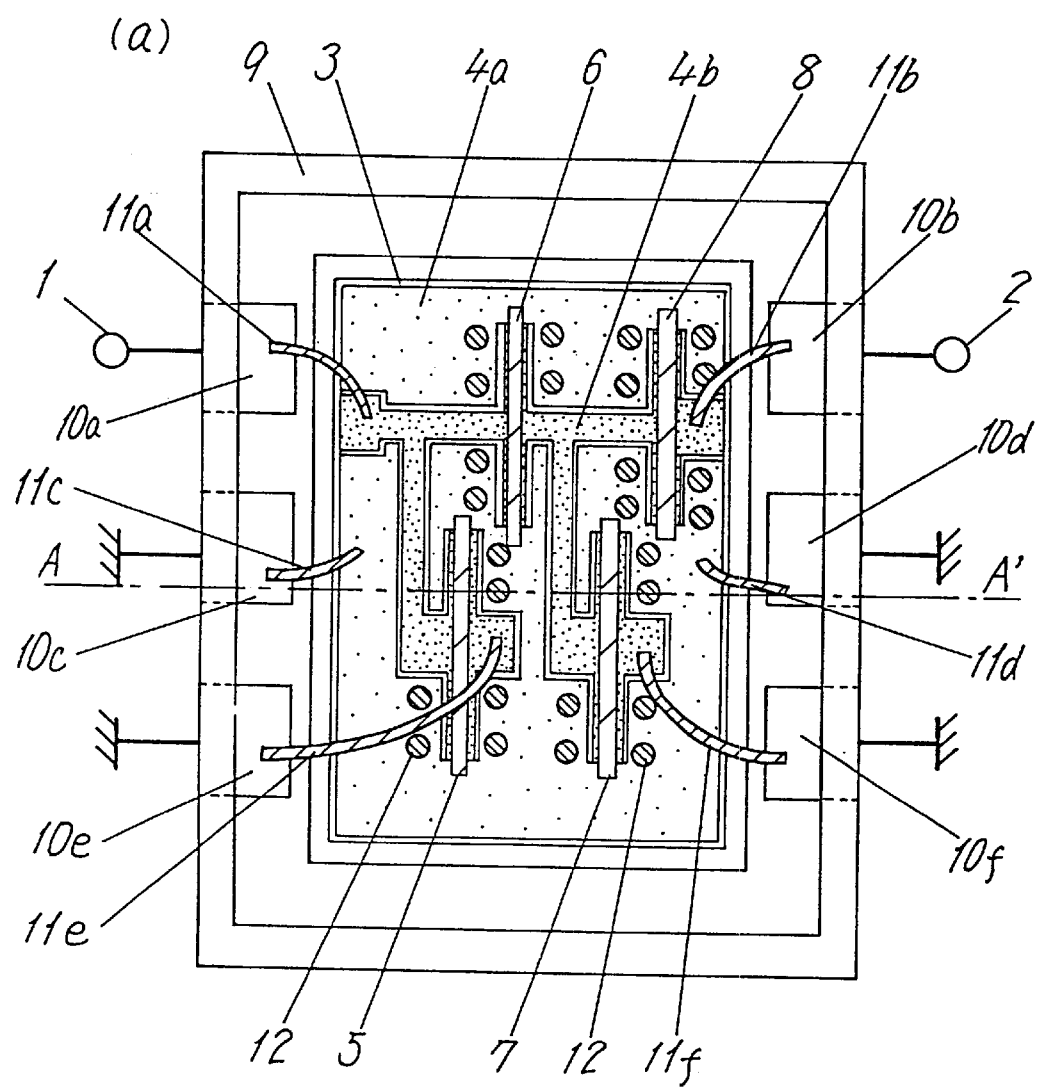
FIG. 1(a) is a top view of a surface acoustic wave filter in embodiment 1 of the invention.
FIG. 1(b) is its sectional view.
Figure 1:
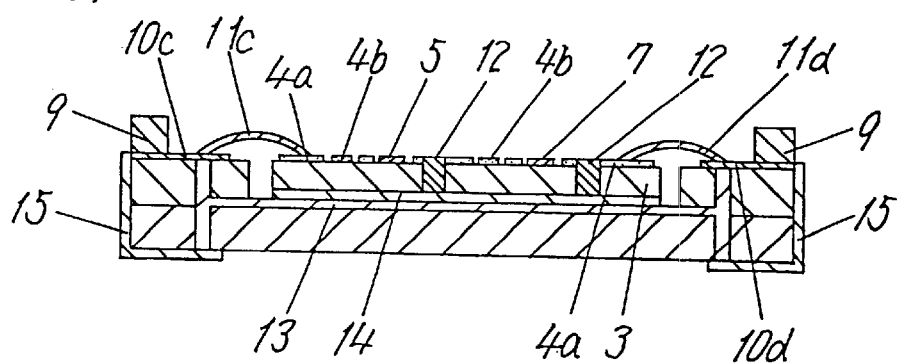

| Reference Numerals | |
| --- | --- |
| 1 | Input terminal |
| 2 | Output terminal |
| 3 | Piezoelectric substrate |
| 4a | Ground pattern |
| 4b | Signal line |
| 5–8 | Resonator |
| 9 | Package |
| 10a–10f | Land |
| 11a–11f | Wire |
| 12 | Through-hole |
| 13 | Internal conductor |
| 14 | Conductive paste |
| 15 | External electrode |

BEST MODE FOR CARRYING OUT THE INVENTION

Embodiment 1

Figure 2:
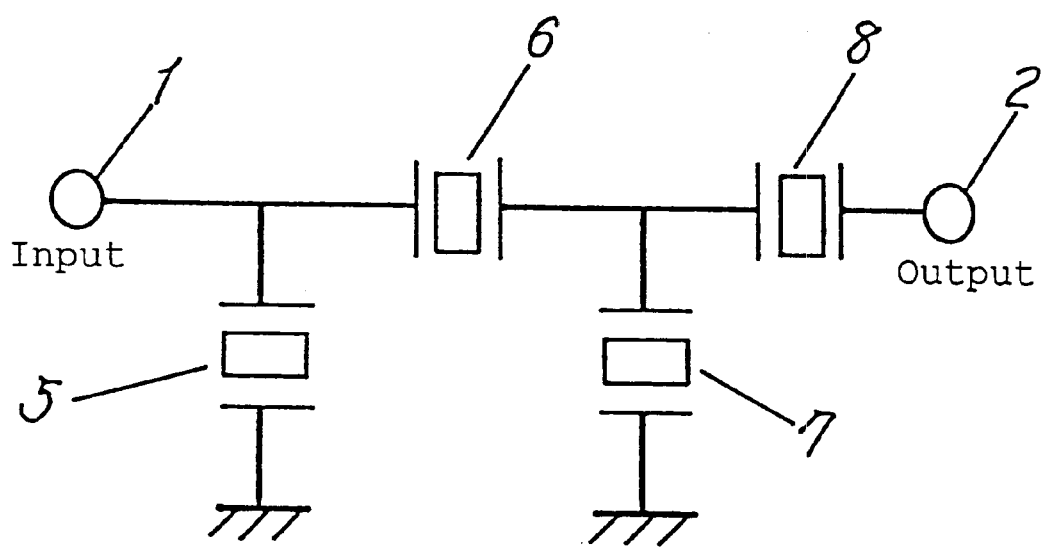
FIG. 2 is a circuit diagram of the same surface acoustic wave filter.

Referring first to FIGS. 1(a), 1(b) and FIG. 2, embodiment 1 of the invention is described below.

FIGS. 1(a) and 1(b) show a surface acoustic wave filter in embodiment 1 of the invention, in which FIG. 1(a) is a top view, and FIG. 1(b) is a sectional view along 1(b)—1(b) in A–A' in FIG. 1(a). FIG. 2 is a circuit diagram of this surface acoustic wave filter In FIGS. 1(a) and 1(b), reference numeral 1 is an input terminal, 2 is an output terminal, 3 is a piezoelectric substrate, 4a is a ground pattern formed on the piezoelectric substrate 3, 5 to 8 are resonators formed in a signal line 4b on the piezoelectric substrate 3, and the surface acoustic wave filter is composed of a comb-shaped electrode pattern (not shown) and reflector patterns (not shown) provided at its both ends. Reference numeral 9 is a package of three-layer laminated body, 10a to 10f are lands formed in the package 9, 11a to 11f are wires for connecting the lands 10a to 10f and the resonators 5 to 8 in the signal line 4b and the ground pattern 4a, and these wires are formed by wire bonding or other method. Further, reference numeral 12 is through-holes provided near the resonators 5 to 8, and these through-holes are filled with a conductive material.

Reference numeral 13 is an internal conductor formed on the lowest layer of the laminated body, and this internal conductor is connected to an external electrode 15 which serves also as a grounding terminal, and is also designed to hold the piezoelectric substrate 3 with the package 9 through a conductive paste 14. The through-holes 12 provided in the piezoelectric substrate 3 are connected to the internal conductor 13 through the conductive paste 14 so as to be connected to the grounding terminal. As the conductive material for filling Up the through-holes 12, meanwhile, when the same material as the conductive paste 14 used for holding the piezoelectric substrate 3 in the package 9 is used, the through-holes 12 may be filled with the conductive material simultaneously when fixing the piezoelectric substrate 3.

This embodiment refers to an example of a ceramic package that can be fabricated in a laminating process. Although not shown, in the process of stacking up the laminated body in three layers, the piezoelectric substrate is mounted, and after lamination, the top opening is sealed by, for example, seam welding or soldering.

The through-holes 12 are formed by sand blasting method of polishing after spraying fine abrasive particles. Generally, the piezoelectric substrate is a monocryatalline, rigid and fragile material, but it can be processed easily and securely by this sand blasting method. The production will be more efficient when through-holes are formed together with the ground pattern in the wafer state. At this time, further, since it is necessary in the sand blasting method to process by forming a resist film on the entire surface of the top of the piezoelectric substrate, it is more convenient for batch processing in the wafer state.

It is a feature of this embodiment that the through-holes 12 are provided near the resonators 5 to 8 and are grounded electrically. In such constitution, in a portable telephone, for example, when this filter is used as the band pass filter or band elimination filter after the power amplifier, in case a large signal is entered from the input terminal 1, the heat generated from the resonators 5 and 6, in particular, closer to the input terminal 1 can be released by way of the through-holes 12, conductive paste 14, internal conductor 13, and grounding terminal, so that the desired filter characteristic may be maintained.

In this embodiment, moreover, since the ground pattern 4a is formed along the resonators 5 to 8 and the signal line 4b, the area of the ground pattern 4a can be kept as wide as possible, so that heat can be released more efficiently.

Also in the embodiment, the through-holes 12 are formed to be grounded electrically. Generally, since the ground portion occupies a wide pattern area in the package, this grounding of through-holes brings about an effect as a heat sink. The invention is not limited to such constitution, and if the through-holes are not grounded electrically, they may be thermally connected to an insulating material of a high thermal conductivity. Such constitution brings about the same effect as a heat sink.

FIG. 2 is a circuit diagram of the surface acoustic wave filter constituted as shown in FIG. 1(a) and 1 (b). More specifically, FIG. 2 shows the filter circuit in which the resonators 5 to 8 are composed in a ladder structure. In this embodiment, particularly, it is designed to feed the signal from the side of the resonators connected in parallel.

In this constitution, in the input impedance behavior of the filter outside of the passing band, that is, in the elimination band, the characteristic near the circle of resistance component 0 of the Smith chart, that is, near the outer circumference is obtained, so that the dual filter or resonator can be designed easily while avoiding the thermal effects.

Embodiment 2

Figure 3:
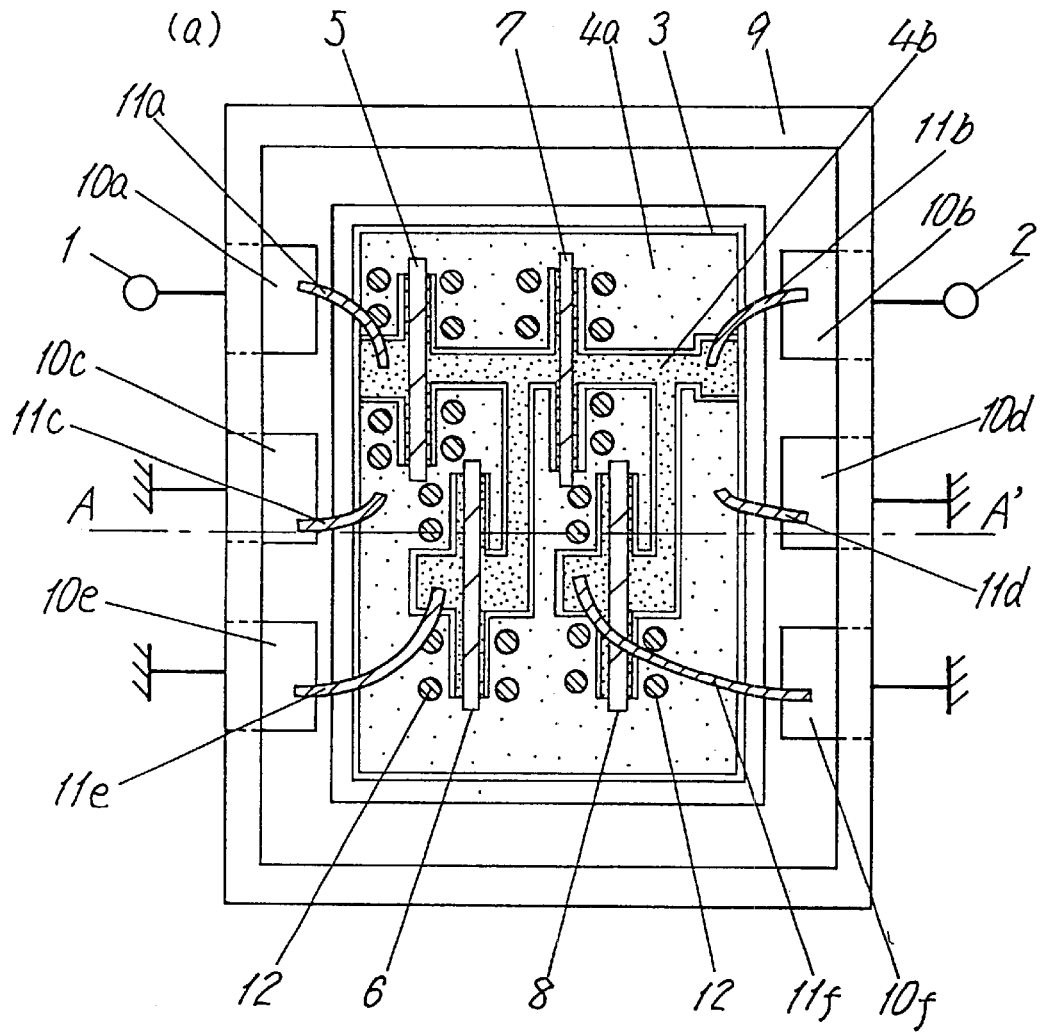
FIG. 3(a) is a top view of a surface acoustic wave filter in embodiment 2 of the invention.
FIG. 3(b) is its sectional view.
Figure 3:
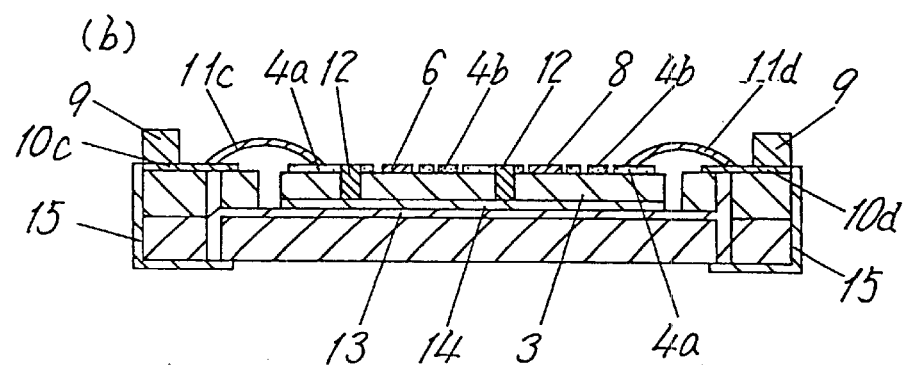
Figure 4:
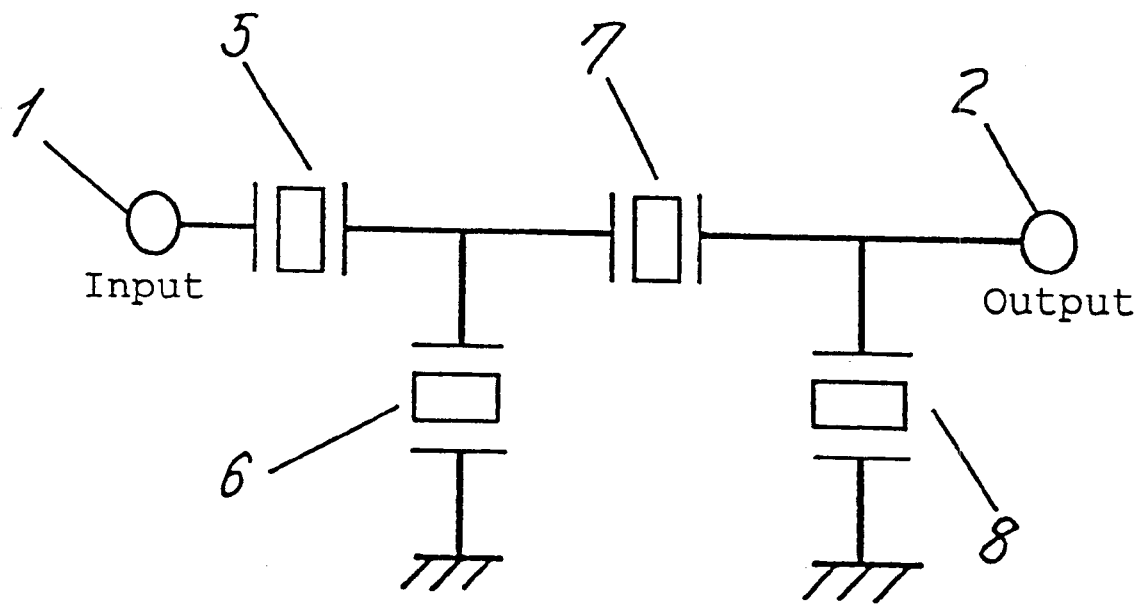
FIG. 4 is a circuit diagram of the same surface acoustic wave filter.
Figure 5:
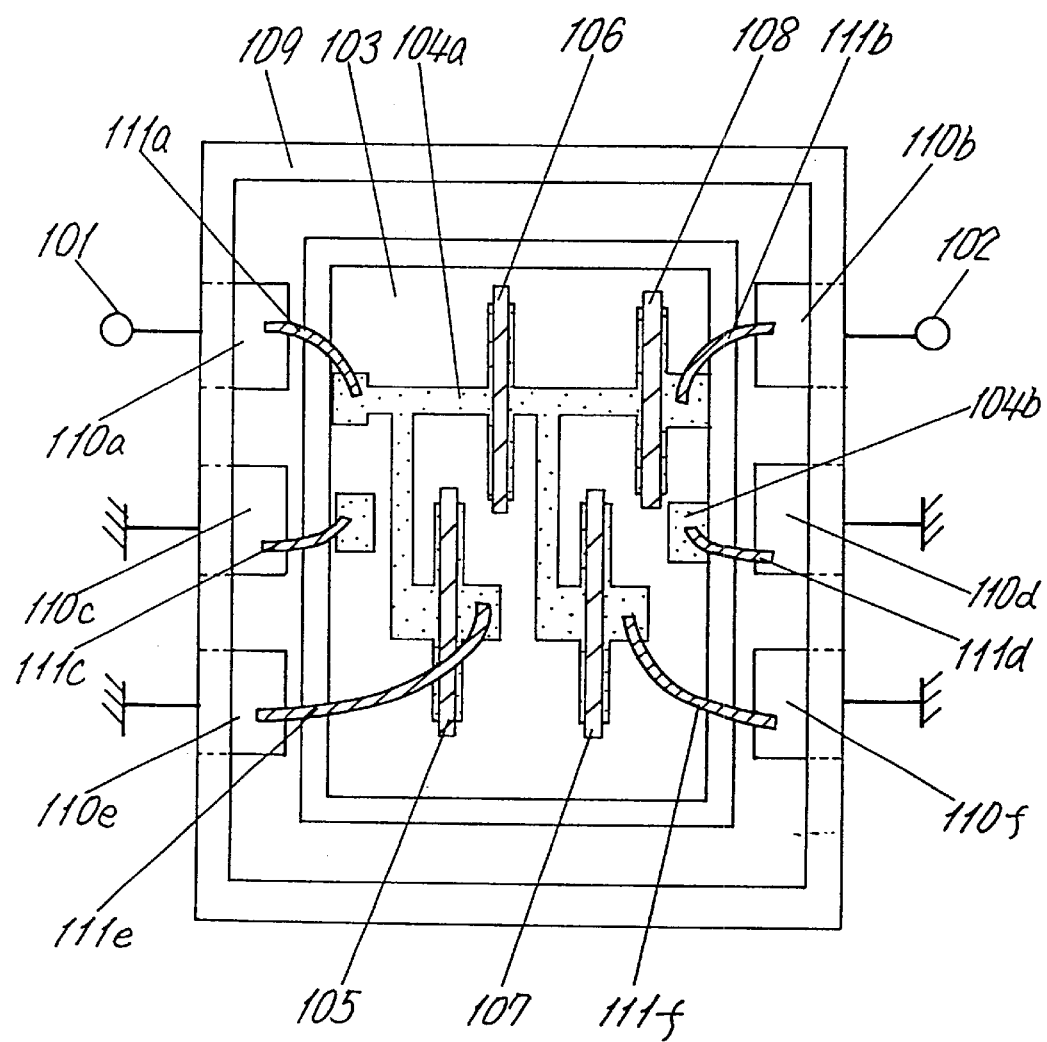
FIG. 5 is a top view of a prior art.

Referring now to FIGS. 3(a), 3(b) and FIG. 4, embodiment 2 of the invention is described.

FIGS. 3(a), 3(b) show a surface acoustic wave filter in embodiment 2 of the invention, in which FIG. 3(a) is a top view, and FIG. 3(b) is a sectional view along line 3(b)—3(b) in A–A' in FIG.(a). FIG. 4 is a circuit diagram of this surface acoustic wave filter In this embodiment, what differs from embodiment 1 is that the input side resonator 5 is connected in series. By thus connecting the first resonator 5 of the input stage in series, in addition to the above action and effect, the input energy can be divided into the resonator 5 and resonator 6. Therefore, a stable surface acoustic wave filter regardless of the input power is realized.

INDUSTRIAL APPLICABILITY

In the invention, as described herein, since the through-holes are provided near the resonators, and these through-holes are grounded electrically, the heat generated in the resonators by input of large signal can be released, so that a stable filter characteristic may be maintained even in the event of input of a large signal.

What is claimed is:

1. A surface acoustic wave filter comprising
    a resonator pattern formed on a piezoelectric substrate,
    a plurality of through-holes provided along said resonator pattern,
    a ground pattern connected to said plurality of through-holes formed on said piezoelectric substrate, said ground pattern being grounded electrically,
    a conductive material filling said plurality of rough-holes,
    an electric insulating material connected to said conductive material, said conductive material and said insulating material having a thermal conductivity,
    wherein the through-holes filled with said conductive material are electrically grounded, and a heat generated in said resonator pattern is released through said ground pattern, said conductive material and said electric insulating material.

2. A surface acoustic wave filter according to claim 1, wherein said through-holes are sufficiently close to said resonator pattern so that heat generated by said resonator pattern is released through said through-holes.

3. The surface acoustic wave filter of claim 1, wherein said ground pattern is formed along the resonator pattern and a signal line.

4. The surface acoustic wave filter of claim 1,
    wherein said resonator pattern has a ladder type electrode pattern, and
    input side resonator of the ladder type electrode pattern is connected parallel.

5. The surface acoustic wave filter of claim 1,
    wherein said resonator pattern has a ladder type electrode pattern, and
    input side resonator of the ladder type electrode pattern is connected in series.

6. The surface acoustic wave filter of claim 1,
    wherein said piezoelectric substrate is formed in a package, and
    a bottom of said piezoelectric substrate is fixed in said package through conductive paste as said conductive material filling up said through-holes.

7. A surface acoustic wave filter comprising
    a resonator pattern formed on a piezoelectric substrate,
    a ground pattern formed on said piezoelectric substrate, said ground pattern disposed at an outer shape of said resonator pattern, said ground pattern being grounded electrically,
    a through-hole provided near said resonator pattern,
    a conductive material filled in said through-hole, said through-hole filled with said conductive material being electrically grounded, and conductive material having a thermal conductivity, wherein a heat generated in said resonator pattern is released through said ground pattern and said conductive material, a package, and a conductive paste, said conductive paste having a thermal conductivity, wherein said conductive paste is disposed at a bottom of said piezoelectric substrate, said conductive paste is connected to said conductive material filled in said through-hole, a bottom of said piezoelectric substrate is fixed in said package through said conductive paste, and said heat generated in said resonator pattern is further released through said conductive material and said conductive paste.

8. The surface acoustic wave filter of claim 7, further comprising an insulating material connected to said conductive material, said insulating material having a thermal conductivity, wherein said heat generated in said resonator pattern is further released through said insulating material.

9. A surface acoustic wave filter comprising a resonator pattern formed on a piezoelectric substrate, a through-hole provided near said resonator pattern, and a conductive material filled in said trough-hole, said conductive material having a thermal conductivity, an insulating material connected to said conductive material, said insulating material having a thermal conductivity, wherein said heat generated in said resonator pattern is released through said conductive material and said insulating material.

10. The surface acoustic wave filter of claim 9, further comprising a ground pattern formed on said piezoelectric substrate, said ground pattern disposed along an outer shape of said resonator pattern, said ground pattern being grounded electrically, wherein said heat generated in said resonator pattern is further released through said ground pattern.

11. The surface acoustic wave filter of claim 9, further comprising a package, and a conductive paste, said conductive paste having a thermal conductivity, wherein said conductive paste is disposed at a bottom of said piezoelectric substrate, said conductive paste is connected to said conductive material filled in said through-hole, a bottom of said piezoelectric substrate is fixed in said package through said conductive paste, and said heat generated in said resonator pattern is further released through said conductive material and said conductive paste.

\* \* \* \* \*

UNITED STATES PATENT AND TRADEMARK OFFICE
CERTIFICATE OF CORRECTION

PATENT NO.   : 6,310,422 B1  Page 1 of 1
DATED        : October 30, 2001
INVENTOR(S)  : Satoh et al.

It is certified that error appears in the above-identified patent and that said Letters Patent is hereby corrected as shown below:

<u>Title page,</u>
Item [57], ABSTRACT, delete in its entirety and insert:
-- A surface acoustic wave filter is capable of obtaining stable filter characteristics. Resonators are formed on a piezoelectric substrate, through-holes are provided near the resonators, and a conductive material fills the through-holes. The through-holes are electrically grounded. By the through-holes provided near the resonators and filled with the conductive material, the heat generated in the resonators when a large signal is applied to the input terminal can be released. Thus, stable filter characteristics may be maintained if a large signal is applied. --

Signed and Sealed this

Fourteenth Day of January, 2003

JAMES E. ROGAN
*Director of the United States Patent and Trademark Office*